(12) United States Patent
Lee et al.

(10) Patent No.: US 7,405,091 B2
(45) Date of Patent: Jul. 29, 2008

(54) METHOD FOR TESTING CONTACT OPEN IN SEMICODUCTOR DEVICE

(75) Inventors: Sung-Kwon Lee, Kyoungki-do (KR); Tae-Woo Jung, Kyoungki-do (KR); Min-Suk Lee, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 251 days.

(21) Appl. No.: 11/020,599

(22) Filed: Dec. 21, 2004

(65) Prior Publication Data

US 2005/0272173 A1    Dec. 8, 2005

(30) Foreign Application Priority Data

Jun. 7, 2004    (KR) .................. 10-2004-0041531

(51) Int. Cl.
    *G01R 31/26* (2006.01)
    *H01L 21/66* (2006.01)

(52) U.S. Cl. ............ 438/17; 257/E21.528; 257/E21.53; 257/E21.531

(58) Field of Classification Search .................. 438/17; 257/E21.528, E21.53, E21.531
    See application file for complete search history.

(56) References Cited

FOREIGN PATENT DOCUMENTS

| JP | 05129389 A | * | 5/1993 |
| JP | 05259240 A | * | 10/1993 |
| KR | 10-0217327 | | 6/1999 |
| KR | 2001-0052044 | | 6/2001 |
| KR | 2002-0077016 | | 10/2002 |

OTHER PUBLICATIONS

Quirk et al., Semiconductor Manufacturing Technology, 2001, Prentice-Hall, p. 515.*
Full English translation of Kuroki, JP 05129389A.*

* cited by examiner

*Primary Examiner*—David A Zarneke
(74) *Attorney, Agent, or Firm*—Blakely, Sokoloff, Taylor & Zafman LLP

(57) ABSTRACT

The present invention is a method for testing a contact open capable of effectively testing a contact open defect in an In-line as securing a mass productivity. The method includes the steps of: performing a photolithography process for forming a contact; forming a contact hole by performing a contact etching process after sampling at least one wafer; depositing a conductive layer on the wafer provided with the contact hole; isolating the conductive layer within the contact hole; performing a test for testing a contact open interface to check whether a remaining layer is existed in an interface between the conductive layer and a lower structure of the conductive layer; and performing a process for etching the contact of a main lot based on a test result.

6 Claims, 4 Drawing Sheets

METHOD FOR TESTING CONTACT OPEN IN SEMICODUCTOR DEVICE

FIELD OF THE INVENTION

The present invention relates to a semiconductor device; and more particularly, to a method for testing a contact open in a semiconductor device.

DESCRIPTION OF RELATED ARTS

In general, a process for forming a contact hole of a semiconductor device, i.e., a contact open process, is a process that etches a nitride layer in a predetermined region by a self-aligned contact (SAC) etching process for an electrical contact between internal constitution elements of the device or between conductive layers and then, connects the nitride layer electrically to a contact region through the medium of a conductive material such as metal or polysilicon.

The contact open process and a step of testing a contact open will be examined in accordance with three conventional methods.

FIG. 1 is a flow chart illustrating a first conventional method of a contact open process and a process for testing a contact open.

First, a previous process for forming various device elements such as a well, a device isolation layer or a transistor is performed on a substrate.

Subsequently, a photolithography process for forming an opening such as a contact hole is performed in a predetermined region of the substrate at step S101.

More specific to the photolithography process, a photoresist is deposited on an insulation layer and then, a photoresist pattern is formed through a photo-exposure process and a developing process. Next, an etching process is employed at step S102. At this time, an etch target layer such as the insulation is selectively etched by using the photoresist pattern as an etch mask, thereby forming a contact hole exposing a lower portion of the insulation layer in which the contact will be formed.

Next, a conductive material is deposited to fill the contact hole at step S103. Then, a conductive pattern is formed by employing the photolithography process and the etching process at step S104.

Next, although not shown, a process for forming a passivation and a process for forming a metal wire are performed, thereby completing a process for forming a semiconductor device.

For an integrated circuit (IC), each chip is subjected to an electrical property test through an electrical property tests, i.e., an electrical die sorting (EDS) test.

Meanwhile, when the contact hole is not formed accurately, the chip is considered as a substandard chip.

A contact defect is resulted from various reasons. For instance, when the photoresist in the contact hole is not completely removed during the photolithography process or the insulation layer in the contact hole is not completely removed during the etching process, the contact defect is generated.

Required equipment and conditions for the photolithography process and the etching process are checked and modified through the electrical property test, thereby improving yields of the IC. However, the EDS test needs a testing period ranging from approximately 2 months to approximately 3 months. Accordingly, an inefficiency is caused in yields of products and a process due to a long testing period.

Therefore, the first preferred embodiment in accordance with the conventional method makes it difficult to predict the yields of the products in advance, thereby generating a problem of greatly increasing the inefficiency in the process.

FIG. 2 is a flow chart illustrating a second conventional contact open process to overcome problems caused by the first conventional contact open process.

Referring to FIG. 2, the second conventional contact open process employs a series of steps of performing a photolithography process for forming a contact at step S201, performing a etching process for forming a contact at step S202, depositing a conductive layer at step S203 and performing a photolithography process and an etching process to a conductive layer at step S204 as the first conventional contact open process does. Then, steps of testing through scanning electron microscope (SEM) at steps S205 to S207 are added after each step of the second preferred embodiment.

Specifically, tests for testing the contact open are performed at steps S205 to S207 through sampling after each of the steps of performing the photolithography process for forming the contact at step S201, performing the etching process for forming the contact at step S202 and performing the photolithography process and the etching process to the conductive layer at step S204. At this time, a contact defect is checked by analyzing an image difference about a contrast of a critical dimension CD through sampling on the SEM.

However, in accordance with the second preferred embodiment, it is required to sample and test at every each step and thus, it is difficult to apply the second preferred embodiment to an actual process. Also, the second preferred embodiment provides a disadvantage that cannot accurately check the contact defect resulted from a defect between interfaces of the conductive layer and the substrate.

Meanwhile, it can be suggested to check the contact open by using a selective epitaxial growth (SEG) of silicon for a contact plug process.

FIG. 3 is a flow chart illustrating a third conventional contact open process.

First, a series of steps for forming a semiconductor device is performed and then, a photolithography process for forming a contact is employed at step S301. Subsequently, an etch target layer such as an insulation layer is etched by using a photoresist pattern (not shown) formed at step S401 by sampling at least one wafer as an etch mask, thereby opening a lower portion.

Next, a contact open defect of the sampled wafer is tested through the SEG process at a high temperature. That is, during the SEG at a temperature ranging from approximately 900° C. to approximately 1,200° C., a single crystal silicon layer is grown in the lower portion where the contact is completely opened, i.e., a silicon substrate and the single crystal silicon layer is not completely grown in a portion where the contact is not completely opened. At this time, the contact open defect is confirmed through an In-line by using one selected from a group consisting of a critical dimension scanning electron microscope (CD-SEM), a broken scanning electron microscope (BROKEN-SEM) and a focused ion beam (FIB) apparatus at step S302, thereby testing the contact open defect at step S305.

Subsequently, an etching process of a main lot is performed according to a result of the sampled wafer, there by forming a conductive layer a contact region etched by using the SEG at step S303.

At this time, in case of forming a plug in an active region between a plurality of gate structures by using the SEG, it is preferable that a thickness of the plug is approximately 1.5 times thicker than that of a gate hard mask. Subsequently, the conductive layer is etched, thereby forming a conductive pattern.

At this time, if necessary, the contact open test can be additionally performed at step S406.

Continuously, an electrical property test such as the EDS test is performed at step S304. Afterwards, either a subsequent process is employed or an additional contact open test is performed at step S307.

Meanwhile, the third conventional contact open process cannot not be used if the SEG is not applied to form the plug.

SUMMARY OF THE INVENTION

It is, therefore, an object of the present invention to provide a method for testing a contact open capable of effectively testing a contact open defect in an In-line as securing mass productivity.

In accordance with one aspect of the present invention, a method for testing a contact open, including the steps of: performing a photolithography process for forming a contact; forming a contact hole by performing a contact etching process after sampling at least one wafer; depositing a conductive layer on the wafer provided with the contact hole; isolating the conductive layer within the contact hole; performing a test for testing a contact open interface to check whether a remaining layer is existed in an interface between the conductive layer and a lower structure of the conductive layer; and performing a process for etching the contact of a main lot based on a test result.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on a preferred embodiment of the present invention will be provided with reference to the accompanying drawings.

Figure 1:
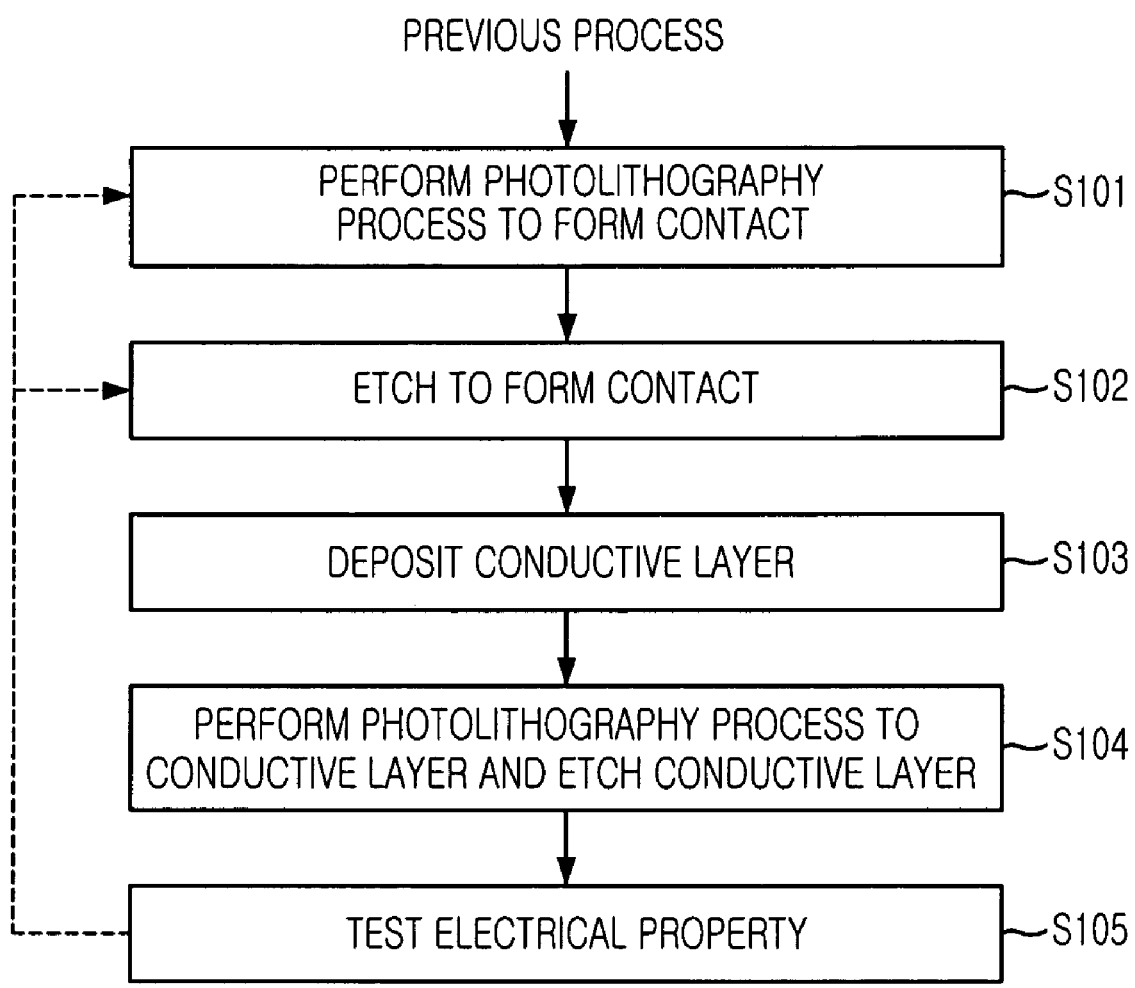
FIG. 1 is a flow chart illustrating a first conventional method of a contact open process and a process for testing a contact open.
Figure 2:
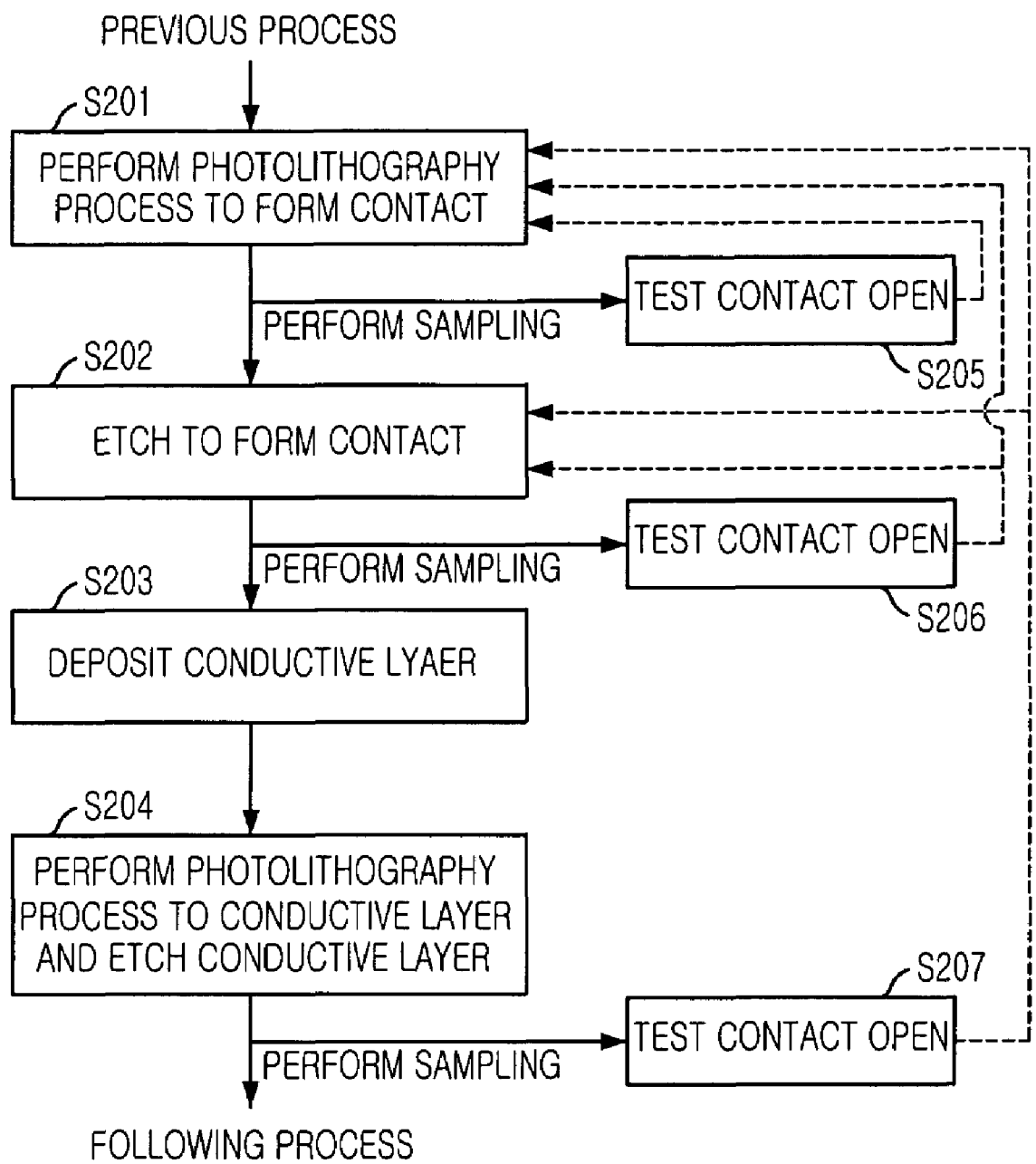
FIG. 2 is a flow chart illustrating a second conventional contact open process.
Figure 3:
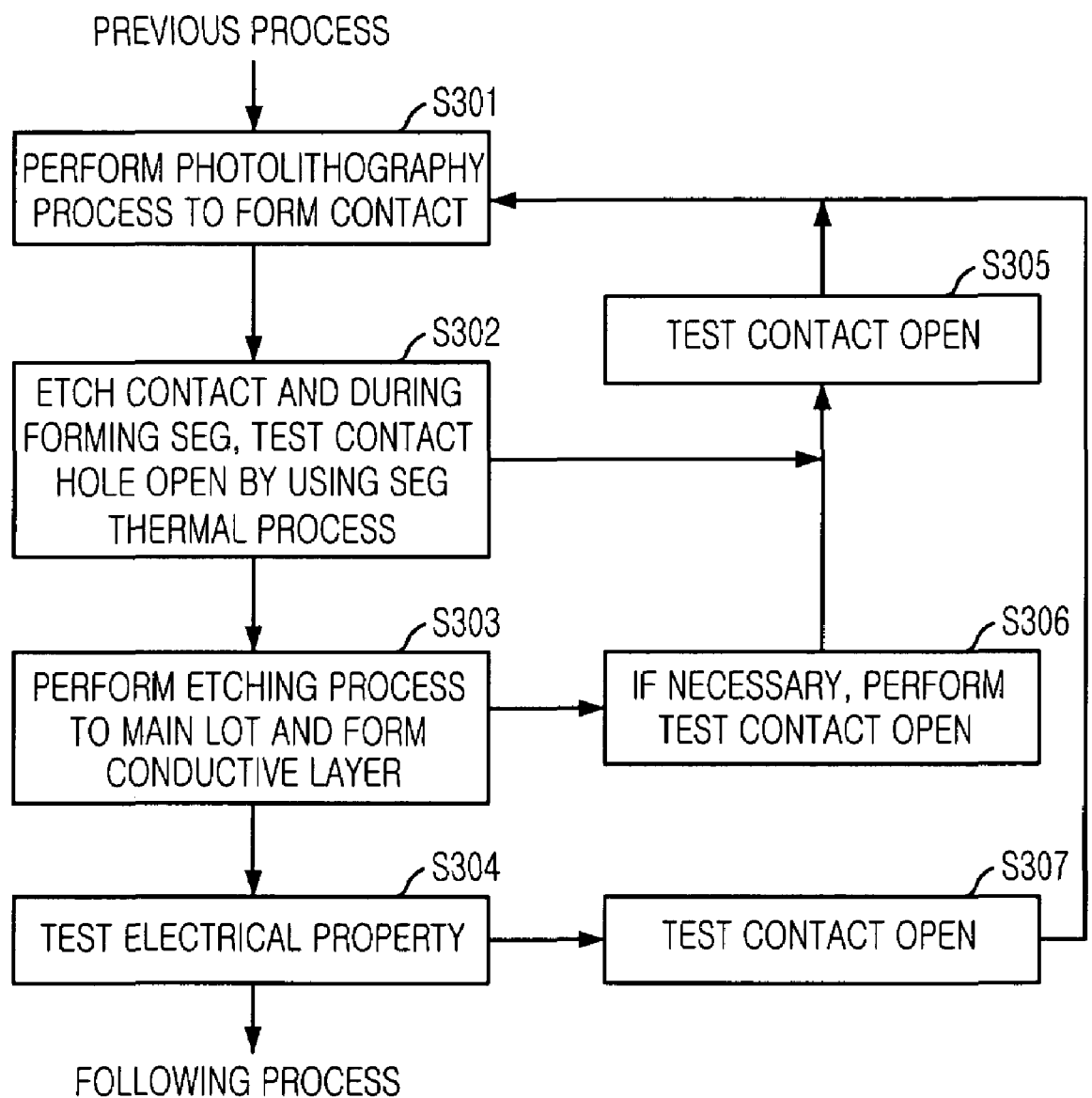
FIG. 3 is a flow chart illustrating a third conventional contact open process.
Figure 4:
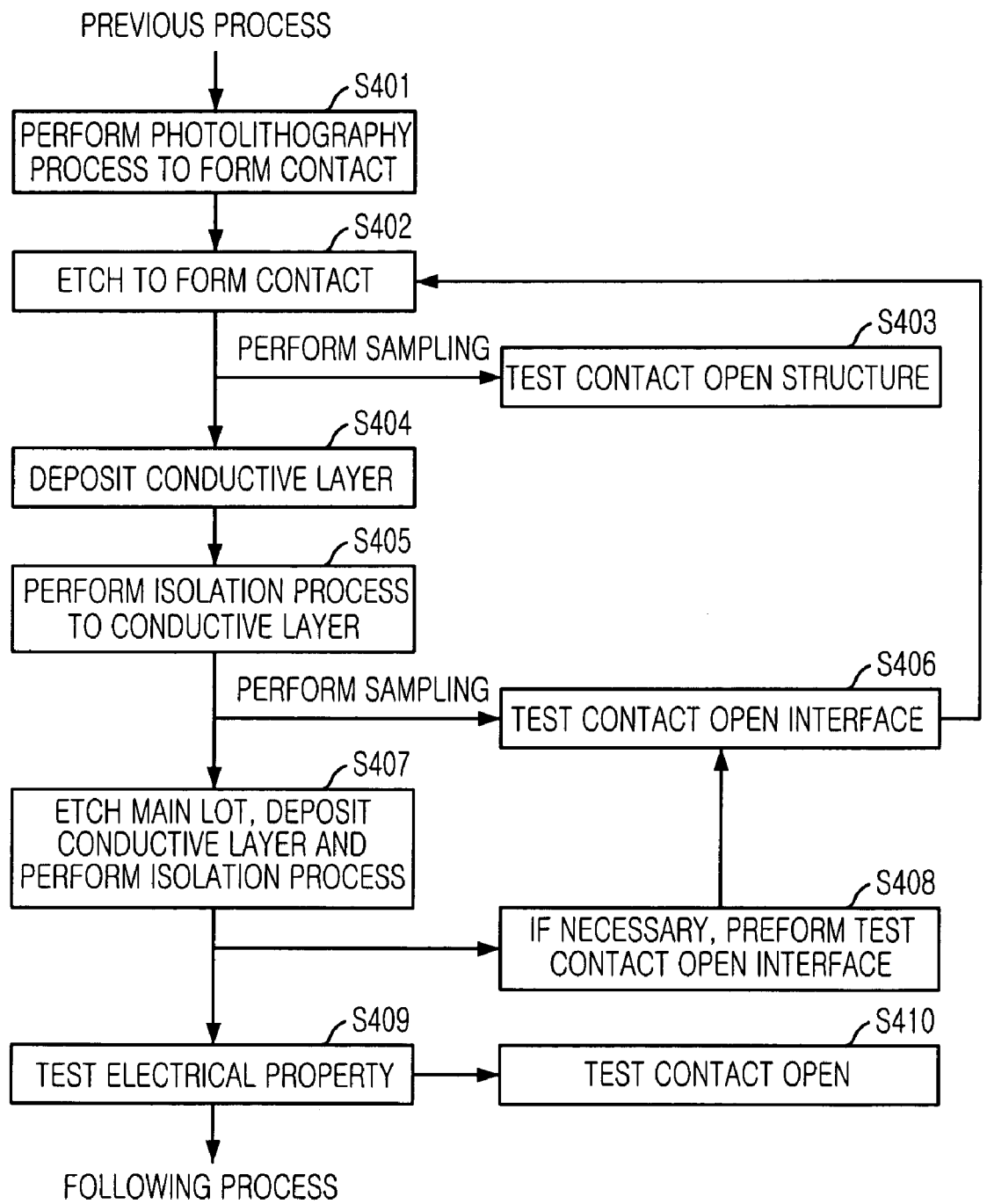
FIG. 4 a flow chart illustrating a contact open process and a process for testing a contact open in accordance with the present invention.

FIG. 4 a flow chart illustrating a contact open process and a process for testing a contact open in accordance with the present invention.

First, a previous process for forming various device elements such as a well, a device isolation layer or a transistor on a wafer is performed.

Subsequently, a photolithography process for forming an opening such as a contact hole in a predetermined portion of the wafer is performed at step S401.

Specifically, an insulation layer is formed on a substrate or a conductive layer and then, a photoresist is deposited on the insulation layer. Afterwards, a photoresist pattern is formed by using a photo-exposure process and a developing process.

Next, an etching process for forming a contact is performed at step S401. That is, the insulation layer which is an etch target layer is selectively etched with use of a photoresist pattern (not shown) formed through the photolithography process as an etch mask by sampling at least one wafer, thereby forming a contact hole exposing a lower portion of the insulation layer which will be contacted.

At this time, a test for testing a contact open structure is performed to check whether an etch profile of the sampled wafer is good or not at step S403. If a result of the test shows a defect, an etch recipe is re-adjusted and then, the test is performed repeatedly.

In case of showing a good test result, a conductive layer is deposited in a portion provided with the contact hole for testing a contact open interface of the sampled wafer at step S404.

The conductive layer is made of a material selected from a group consisting of polysilicon, tungsten (W), titanium nitride (TiN) and titanium (Ti) and is deposed by using a typical depositing method or a SEG method.

Next, a planarization process is performed to fill the conductive layer inside of the contact hole. That is, an isolation process for isolating the conductive layer is employed. The isolation process is performed by using an etch back process or a chemical mechanical polishing (CMP) process at step S405.

Subsequently, a test for testing the contact open interface is proceeded to check whether a remaining layer is existed on an interface between the conductive layer and a lower structure at step S406.

The test for testing the contact open interface uses one of a scanning electron microscope (SEM) and a focused ion beam. (FIB) apparatus. During observing an image taken by using the SEM or the FIB, if the remaining layer with an extremely thin thickness is existed between the conductive layer and the lower structure, i.e., a substrate and another conductive layer, a black spot appears on the image. Through observing this image, the test for testing the contact open interface is performed. The black spot is a potential image that can be shown on the remaining layer, i.e., the etch target layer such as the insulation layer, by trapping a secondary electron through the SEM or the FIB apparatus in case of not opening the contact hole. The test for testing the contact open interface can be more easily performed by appropriately controlling a difference in a voltage contrast of the secondary electron.

As described above, the test for testing the contact open interface is performed in an In-line by using one selected from a group consisting of a scanning electron microscope (SEM), a scanning electron microscope inspection system (SEM-SPEC), a critical dimension scanning electron microscope (CD-SEM), a broken scanning electron microscope (BROKEN-SEM) and a focused ion beam (FIB) apparatus.

Next, if a contact open interface defect is not existed as a result of the sampled wafer, the etching process applied to the sampled wafer is subjected to a main lot. Afterwards, the conductive layer is deposited and then, the isolation process is employed at step S407.

Meanwhile, if a contact open interface defect is existed as a result of the sample wafer, a separate etching process or a separate cleaning process can be performed for removing the remaining layer.

At this time, an additional test for testing the contact open interface can be performed, if necessary at step S408.

Continuously, an electrical property test such as an electrical die sorting (EDS) test is performed at step S409 and then, a subsequent process is employed.

At this time, a final test for testing the contact open is proceeded at step S410.

Meanwhile, the test for testing the contact open described above provides a disadvantage causing a loss in a corresponding wafer. Accordingly, the test is performed to a main split instead of every lot. Also, the test is employed if it is necessary to change and periodically monitor a process. Therefore, it is possible to increase a mass productivity by minimizing a loss of the wafer.

The present invention employs a test for testing a contact open interface by depositing a conductive layer and performing an isolation process, thereby detecting a contact open defect in an early stage and improving a mass productivity.

The present invention detects a contact open defect which is a factor causing a wrong operation in an early stage, thereby improving a mass productivity. Accordingly, the present invention provides an effect of improving yields of products and productivity.

The present application contains subject matter related to the Korean patent application No. KR 2004-0041531, filed in the Korean Patent Office on Jun. 7, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for testing a contact open in a semiconductor device, comprising the steps of:
    performing a photolithography process for forming a contact;
    forming a contact hole by performing a contact etching process after sampling at least one wafer;
    performing the test for testing a contact open by sampling at least one wafer;
    depositing a conductive layer on the wafer provided with the contact hole;
    isolating the conductive layer within the contact hole by using one of a chemical mechanical process and an etch back process in order to test the contact open;
    performing a test for testing a contact open interface to check whether a remaining layer exists in an interface between the conductive layer and a lower structure of the conductive layer;
    performing a process for etching the contact of a main lot based on a test result;
    forming the conductive layer in the etched contact region;
    performing the isolation process, a test process of an electrical property and a test process of the contact open.

2. The method of claim 1, wherein the test for testing the contact open interface is more easily performed by appropriately controlling a difference in a secondary electron.

3. The method of claim 1, wherein the test for testing the contact open interface is performed by using one of a scanning electron microscope (SEM) and a focused ion beam (FIB) apparatus.

4. The method of claim 1, wherein a process for testing the contact open performed by sampling the wafer is employed to a main split, a time of changing a process and a time of monitoring the process periodically.

5. The method of claim 2, wherein during testing the contact open interface, if a black spot is existed on an image, the black spot is considered as being appeared by a remaining layer existing between the conductive layer and a lower structure of the conductive layer.

6. The method of claim 1, wherein further includes a step of testing a contact open interface based on the needs after performing the isolation process to the main lot.

* * * * *

UNITED STATES PATENT AND TRADEMARK OFFICE
CERTIFICATE OF CORRECTION

| | | |
|---|---|---|
| PATENT NO. | : 7,405,091 B2 | Page 1 of 1 |
| APPLICATION NO. | : 11/020599 | |
| DATED | : July 29, 2008 | |
| INVENTOR(S) | : Lee et al. | |

It is certified that error appears in the above-identified patent and that said Letters Patent is hereby corrected as shown below:

In Item [54] Title, line 2, please delete "SEMICODUCTOR" and insert -- SEMICONDUCTOR --.

Col. 1, line 2, please delete "SEMICODUCTOR" and insert -- SEMICONDUCTOR --.

Signed and Sealed this

Seventeenth Day of March, 2009

JOHN DOLL
*Acting Director of the United States Patent and Trademark Office*